United States Patent [19]

Sakaguchi et al.

[11] 4,412,886
[45] Nov. 1, 1983

[54] METHOD FOR THE PREPARATION OF A FERROELECTRIC SUBSTRATE PLATE

[75] Inventors: Susumu Sakaguchi, Annaka; Kenichi Taguchi, Joetsu; Masaaki Iguchi; Kunihiro Ito, both of Annaka, all of Japan

[73] Assignee: Shin-Etsu Chemical Co., Ltd., Tokyo, Japan

[21] Appl. No.: 481,823

[22] Filed: Apr. 4, 1983

[30] Foreign Application Priority Data

Apr. 8, 1982 [JP] Japan ................................. 57-58533

[51] Int. Cl.$^3$ ..................... B44C 1/22; C03C 15/00; C03C 25/06; H01L 21/306
[52] U.S. Cl. ................................. 156/645; 156/636; 156/667; 252/79.3
[58] Field of Search ............... 252/79.3; 156/636, 645, 156/651, 662, 667; 51/281 R, 317, 318, 323

[56] References Cited

U.S. PATENT DOCUMENTS 3,860,467  1/1975  Lim ................................. 252/79.3 X
3,954,940  5/1976  Rice et al. ......................... 156/645 X
4,390,392  6/1983  Robinson et al. ............... 156/645 X

*Primary Examiner*—William A. Powell
*Attorney, Agent, or Firm*—Hopgood, Calimafde, Kalil, Blaustein, & Judlowe

[57] ABSTRACT

The invention provides a method for surface-finishing of a single crystal wafer of a ferroelectric material into a substrate plate suitable for use, for example, as a SAW filter element which is mirror-polished only on one of the surfaces, the other surface having an adequate roughness. Different from conventional methods, the inventive method comprises the successive steps of (a) slicing a single crystal boule into wafers, (b) lapping of the wafer on both surfaces to impart adequate roughness to the surfaces, (c) chemically etching the thus lapped surfaces to remove the strain produced in the preceding mechanical working, and (d) mirror-polishing one of the thus etched surfaces so that high uniformity of the thickness and greatly decreased warping of the wafer can be ensured.

5 Claims, No Drawings

METHOD FOR THE PREPARATION OF A FERROELECTRIC SUBSTRATE PLATE

BACKGROUND OF THE INVENTION

The present invention relates to a method for the preparation of a substrate plate of a ferroelectric material or, more particularly, to a method for the preparation of a high-quality substrate plate of a ferroelectric material in a high yield from a wafer of the ferroelectric material by removing the strain produced therein by mechanical working.

As is known, several ferroelectric single crystals such as lithium tantalate $LiTaO_3$, lithium niobate $LiNbO_3$ and the like are prepared by the so-called Czochralski method and wafers obtained by slicing these single crystal boules are useful as a material as a crystal for laser beam modulation or as a material used in various kinds of electronic instruments including sensor elements.

When a wafer of such a ferroelectric single crystal is used as a substrate for an electronic element such as a substrate for SAW (surface acoustic wave) filter elements and the like, the wafer as sliced from a single crystal boule by use of a diamond blade must be finished on both surfaces to have adequate surface roughness by mechanical means. That is, one of the wafer surfaces is finished by mirror-polishing while the other surface should be imparted with an adequate roughness by lapping with an object to remove bulk waves. In compliance with the recent trend that the frequency range in which SAW filter elements are used is expanding toward high frequency region and smaller and smaller elements are used in electronic circuits, the requirement for the mechanical finishing of such a substrate plate has become extremely severe.

The conventional methods for finishing the surface conditions, i.e. mirror-polishing on one surface and lapping to impart adequate roughness to the other surface, are as follows. That is, a wafer of lithium tantalate or other ferroelectric material prepared by slicing a single crystal boule thereof is first mirror-polished on one surface and then lapping is undertaken on the other surface to impart an adequate roughness. This procedure of surface finishing is defective in several respects. For example, (1) the warping of such a finished wafer is as large as 80 to 120 $\mu m$ (see Japanese Patent Kokai 53-288), (2) the procedure of working is necessarily complicated because lapping or polishing on one surface is usually carried out by holding the wafer as adhesively bonded to a holder plate so that the procedure involves the steps of adhesive bonding and peeling after completion of finishing of the surface, (3) a wafer as sliced from a single crystal boule has a large surface roughness as well as poor parallelism between surfaces, i.e. large difference in thickness from portion to portion, so that a long working time is required to finish the surface into a mirror-polished condition by removing the strain in the surface layer produced by the mechanical working and (4) the wafer is sometimes cracked during polishing owing to the warping or strain of the wafer (see Japanese Patent Kokai 54-894). These disadvantages result in decreased yield of satisfactorily finished wafers and low productivity of the working with consequent decrease in the yield of the devices made of the ferroelectric material.

Alternatively, an improved procedure has been proposed for the surface finishing of a wafer of this kind in which a wafer obtained by silicing of a single crystal boule is subjected to lapping on one surface only followed by chemical etching so as to remove the strain produced by mechanical working with the ruggedness of the surface retained as such (see Japanese Patent Kokai 54-11693). This method is indeed effective in reducing the warping of the wafer, i.e. the first of the above mentioned four disadvantages, to about 10 to 15 $\mu m$ but quite ineffective in respect to the disadvantages (2) to (4) above.

Further alternatively, a method is proposed in Japanese Patent Kokai 54-894 according to which a wafer obtained by slicing a single crystal boule is, without subjecting to lapping, coated and masked with a protective film and then subjected to etching. This method is effective to given improvements in (1) and (4) of the above mentioned disadvantages (1) to (4) although this method involves another problem of the very troublesome step of chemical etching.

Moreover, the mirror-polished surface and the other surface imparted with ruggedness by lapping are finished one after the other so that improvements in the parallelism between the surfaces of the wafer and the flatness of the mirror-polished surface are limited with unsatisfactory accuracy of surface conditions notwithstanding the very severe requirements for the manufacture of SAW filter elements in high-frequency use suitable for modern communication instruments.

SUMMARY OF THE INVENTION

An object of the present invention is therefore to provide a novel and improved method for the preparation of a substrate plate of a ferroelectric material free from the above described disadvantages and problems in the prior art methods.

The method of the present invention for the preparation of a substrate plate of a ferroelectric material comprises the steps of:

(a) slicing a single crystal boule of a ferroelectri material into wafers;

(b) lapping both surfaces of the wafer to impart an adequate roughness;

(c) subjecting the thus lapped surfaces to chemical etching to remove the strain produced by the steps of slicing and lapping; and (d) subjecting one of the surfaces to mirror-polishing.

DETAILED DESCRIPTION OF THE PREFERRED EMBODIMENTS

The above described method of the present invention has been established as a result of the extensive investigations undertaken by the inventors in connection with a process for the preparation of ferroelectric substrate plates from wafers prepared by slicing a single crystal boule of a ferroelectric material. That is, the chemical etching of both surfaces of a wafer having been lapped simultaneously is very effective in uniformly removing the strain on the surfaces produced by the steps of slicing and lapping and greatly reducing the thickness difference of the wafer from portion to portion.

Accordingly, the problems or disadvantages (1) to (4) in the prior art methods described above can be solved simultaneously as follows.

(1) Warping of a wafer can be decreased to 8 $\mu m$ or smaller and thickness difference of the wafer can be 5 $\mu m$ or smaller with remarkably improved parallelism.

(2) The margin to be removed by the mirror-polishing can be decreased with consequent decrease in the working time.

(3) Cracking of the wafers during polishing can be reduced greatly as a result of the decreased warping of the wafer and the residual strain caused by the mechanical working.

As a consequence, a great advantage is obtained by the inventive method in the improved yield of ferroelectric substrate plates having much higher accuracy in the surface conditions than in the prior art methods.

The first step of the inventive method is slicing of a single crystal boule of a ferroelectric material grown, for example, by the so-called Czochralski method into wafers. The technique of slicing is well known in the art by use of a suitable slicing machine using a disk-like cutter diamond-bladed on the outer periphery or an annular cutter diamond-bladed on the inner periphery. The thickness of each wafer is of course determined according to the particular application of the wafer material but it is usually in the range from 400 to 1200 μm.

The next step is lapping of the thus obtained wafer on both surfaces, which can be performed in a conventional double-side lapping machine by use of a lapping powder such as silicon carbide, aluminum oxide and the like. The procedure of lapping is completed when a layer of a thickness of 20 to 80 μm or 50 μm on an average has been removed from the surface of the wafer.

The step to follow the above mentioned lapping is the chemical etching of the lapped surfaces to remove the strain produced by the mechanical working, i.e. slicing and lapping. This step of chemical etching is performed, for example, by dipping and keeping the lapped wafer in an etching solution, which may be a 2:1 mixture of hydrofluoric acid and nitric acid, for 15 to 60 minutes at a temperature near to the boiling point of the etching solution followed by rinsing with clean water. The thickness of the surface layer to be removed by this chemical etching should be in the range from about 1 to about 5 μm depending on the type and particle size of the lapping powder used in the preceding step.

The final step of the inventive method is the mirror-polishing of one of the surfaces having been subjected to the chemical etching in the preceding step. Mirror-polishing of the etched surface may be performed by use of a polishing powder such as a colloidal silica and completed when the surface layer of a thickness of about 5 to about 20 μm has been removed by polishing.

According to the above described inventive method, substrate plates with excellent surface conditions can be readily obtained with very little thickness difference of about 2 μm or smaller and warping of about 5 μm or smaller in addition to the surface roughness of 30 A/50 μm or smaller. Furthermore, the step of the chemical etching involved in the inventive method is effective to completely remove any particles of the lapping powder used in the step of lapping and remaining on the surface of the wafer so that completeness of mirror-polishing is ensured to give defect-free substrate plates of the ferroelectric material.

Following are the examples to illustrate the inventive method in more detail.

EXAMPLE 1

A single crystal boule of lithium tantalate having a diameter of 2 inches as grown by the Czochralski method in the direction of the <012> axis was sliced into wafers of each about 930 μm thickness by use of an annular cutter diamond-bladed on the inner periphery.

Each of the wafers was then lapped on both surfaces by use of a FO#240 lapping powder of aluminum oxide to decrease a thickness of about 50 μm on each surface. The thus lapped wafer was further subjected to chemical etching by dipping in a 2:1 mixture of hydrofluoric acid and nitric acid heated at a temperature near to its boiling point to decrease a thickness of about 5 μm on each surface and finally mirror-polished on one of the surfaces by use of a colloidal silica as a polishing powder.

The substrate plate of lithium tantalate prepared in the above described manner was absolutely defect-free and had a thickness difference of 2 μm from portion to portion, warping of 4 μm and surface roughness of 30 Å/50 μm or smaller. The yield of the wafers was increased to 92% from a conventional yield of 52% by the procedure of lapping on one surface and separate mirror-polishing on the other surface.

EXAMPLE 2

A single crystal rod of lithium tantalate having a diameter of 3 inches as grown by the Czochralski method was sliced into wafers of each about 800 μm thickness in the same manner as in Example 1.

Each of the wafers was then lapped on both surfaces by use of a GC#1000 lapping powder of silicon carbide to decrease a thickness of about 50 μm on each of the surfaces followed by the chemical etching on both surfaces and mirror-polishing on one of the surfaces in the same manner as in Example 1 to give a substrate plate of lithium tantalate.

The thus finished substrate plate of lithium tantalate was absolutely defect-free and had a thickness difference of 4 μm, warping of 6 μm and surface roughness of 30 Å/50 μm or smaller. The yield of the wafers in this working process was increased to 89% from a conventional yield of 53%.

What is claimed is:

1. A method for the preparation of a substrate plate of a single-crystalline ferroelectric material which comprises the steps of:
   (a) slilcing a single crystal boule of the ferroelectric material into wafers;
   (b) lapping the wafer on both surfaces to impart an adequate roughness;
   (c) subjecting the thus lapped surfaces of the wafer to chemical etching to remove the strain produced in the steps of slicing and lapping; and
   (d) subjecting one and only one of the surfaces to mirror-polishing.

2. The method as claimed in claim 1 wherein the wafer has a thickness of about 400 μm to about 1200 μm.

3. The method as claimed in claim 1 wherein the step of lapping is performed to decrease a thickness of about 20 μm to about 80 μm on each of the surfaces of the wafer.

4. The method as claimed in claim 1 wherein the step of the chemical etching is performed to decrease a thickness of about 1 μm to about 5 μm on each of the surfaces of the wafer.

5. The method as claimed in claim 1 wherein the step of mirror-polishing is performed to decrease a thickness of about 5 μm to about 20 μm on the surface of the wafer.

* * * * *